(12) United States Patent
Kang et al.

(10) Patent No.: US 9,960,118 B2
(45) Date of Patent: May 1, 2018

(54) CONTACT USING MULTILAYER LINER

(71) Applicant: GLOBALFOUNDRIES INC., Grand Cayman (KY)

(72) Inventors: Donghun Kang, Niskayuna, NY (US); Neal A. Makela, Fishkill, NY (US); Christopher C. Parks, Poughkeepsie, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 64 days.

(21) Appl. No.: 15/001,956

(22) Filed: Jan. 20, 2016

(65) Prior Publication Data

US 2017/0207175 A1    Jul. 20, 2017

(51) Int. Cl.
*H01L 23/48* (2006.01)
*H01L 23/52* (2006.01)
*H01L 29/40* (2006.01)
*H01L 23/532* (2006.01)
*H01L 21/768* (2006.01)

(52) U.S. Cl.
CPC .. *H01L 23/53266* (2013.01); *H01L 21/76846* (2013.01)

(58) Field of Classification Search
CPC .................................................. H01L 23/53266
USPC ....................................................... 257/751
See application file for complete search history.

(56) References Cited

U.S. PATENT DOCUMENTS

| | | | |
|---|---|---|---|
| 5,035,768 A | 7/1991 | Mu et al. | |
| 5,364,803 A | 11/1994 | Lur et al. | |
| 5,488,014 A | 1/1996 | Harada et al. | |
| 5,521,114 A | 5/1996 | Rajeevakumar | |
| 6,953,724 B2 | 10/2005 | Edleman et al. | |
| 7,897,512 B2 | 3/2011 | Cho et al. | |
| 2005/0093155 A1 | 5/2005 | Kahlert et al. | |
| 2010/0301491 A1* | 12/2010 | Yang .................. | H01L 21/02063 257/773 |
| 2011/0233778 A1 | 9/2011 | Lee et al. | |
| 2014/0061931 A1 | 3/2014 | Kang | |

\* cited by examiner

*Primary Examiner* — Hsin-Yi Hsieh
(74) *Attorney, Agent, or Firm* — Gibb & Riley, LLC; Yuanmin Cai, Esq.

(57) ABSTRACT

An opening is formed within a substrate made of a silicon material, and a cleaning process is performed; after which, the bottom and walls of the opening are contaminated with oxygen and fluorine particles. A lower blocking layer is formed within the opening, and the lower blocking layer contacts the bottom and walls of the opening. Also, a middle liner layer is formed within the opening, and the middle liner layer contacts the lower blocking layer. Additionally, an upper blocking layer is formed within the opening, and the upper blocking layer contacts the middle liner layer. Further, a conductor layer is formed within the opening, and the conductor layer contacts the upper blocking layer. The lower blocking layer prevents the fluorine particles from affecting the other layers.

14 Claims, 5 Drawing Sheets

CONTACT USING MULTILAYER LINER

BACKGROUND

The present disclosure relates to integrated circuit devices, and more specifically, to contacts within such devices that utilize liners.

Multi-layer integrated circuit structures are often formed to have many layers of active devices separated by insulator layers. Electrically conductive contacts (CA) are formed within such layers and between such layers within the integrated circuit structures. These contacts are usually created by forming an opening, and then filling the opening with a conductive material. Often, a cleaning process is performed before the openings are filled with the conductive material, and after such cleaning processes undesirable materials that can affect the operation of the contacts remain.

SUMMARY

Exemplary methods herein perform various steps including patterning at least one opening within a substrate that is made from a silicon material, and performing a cleaning process of the opening after patterning. Contamination, such as oxygen and fluorine particles, can remain after the cleaning process.

In order to provide a barrier to such fluorine particles, these methods form a three-layer barrier that is made of a lower blocking layer, a middle liner layer, and an upper blocking layer. The lower blocking layer is formed within the opening (the lower blocking layer directly contacts the surface of the opening), the middle liner layer is formed within the opening (the middle liner layer directly contacts the lower blocking layer), and the upper blocking layer is formed within the opening (the upper blocking layer directly contacts the middle liner layer). After this, these methods fill the opening with a conductor layer (that directly contacts the upper blocking layer). The lower blocking layer prevents the fluorine particles from affecting the other layers.

The lower blocking layer and the upper blocking layer can be made of titanium composite materials (e.g., titanium nitride (TiN), titanium silicide (TiSi), titanium carbide (TiC), titanium alumide (TiAl), etc.), tungsten composite materials (e.g., fluorine-free tungsten (FFW), tungsten nitride (WN), tungsten carbide (WC), etc.), tantalum composite materials (e.g., tantalum nitride (TaN)), or nickel composite materials (e.g., nickel silicide (NiSi)), etc. The middle liner layer can be made of titanium (Ti), tungsten (W), tantalum (Ta), nickel (Ni), titanium alumide (TiAl), titanium aluminum carbide (TiAlC), etc.

In such processing, the upper blocking layer is formed thicker than the lower blocking layer. For example, the upper blocking layer can be formed to be at least 3×, 5×, 10×, etc., thicker (in the directions from the bottom and walls of the opening) than the lower blocking layer. Additionally, the middle liner layer can include an oxide, where the oxide is formed from some of the oxygen scavenged from the bottom of the opening.

Such processing forms various devices, and such devices include, among other structures, a substrate made from a silicon material, and at least one opening within the substrate. The opening has opening walls that are approximately perpendicular to the surface of the substrate. The opening has a bottom approximately parallel to the surface of the substrate, the bottom of the opening is positioned distal to (meaning the portion of the structure that is furthest away from) the surface of the substrate, and the walls of the opening are between the surface of the substrate and the bottom of the opening. The bottom of the opening and the opening walls are contaminated with oxygen and fluorine particles as the result of a post-etching (post-patterning) cleaning process.

In order to provide a barrier to such fluorine particles, these structures include a three-layer barrier that is made of a lower blocking layer, a middle liner layer, and an upper blocking layer (where the middle liner layer is between the lower blocking layer and the upper blocking layer, and this will block fluorine from a tungsten precursor). Thus, the lower blocking layer is within the opening (the lower blocking layer contacts the bottom of the opening and the opening walls); the middle liner layer is within the opening (the middle liner layer contacts the lower blocking layer); and the upper blocking layer is within the opening (the upper blocking layer contacts the middle liner layer). Further, a conductor layer fills the remainder of the opening, and the conductor layer therefore directly contacts the upper blocking layer. The lower blocking layer prevents the fluorine particles from affecting the other layers.

The lower blocking layer and the upper blocking layer can be made of titanium composite materials (e.g., titanium nitride (TiN), titanium silicide (TiSi), titanium carbide (TiC), titanium alumide (TiAl), etc.), tungsten composite materials (e.g., fluorine-free tungsten (FFW), tungsten nitride (WN), tungsten carbide (WC), etc.), tantalum composite materials (e.g., tantalum nitride (TaN)), or nickel composite materials (e.g., nickel silicide (NiSi)), etc. The middle liner layer can be made of titanium (Ti), tungsten (W), tantalum (Ta), nickel (Ni), titanium alumide (TiAl), titanium aluminum carbide (TiAlC), etc.

In this structure, the upper blocking layer is thicker than the lower blocking layer; and can be, for example, at least 3×, 5×, 10×, etc., thicker (in the directions from the bottom and walls of the opening) than the lower blocking layer. Additionally, the middle liner layer can include an oxide. The oxide within the middle liner layer includes the oxygen scavenged from the bottom of the opening.

BRIEF DESCRIPTION OF THE DRAWINGS

The embodiments herein will be better understood from the following detailed description with reference to the drawings, which are not necessarily drawn to scale and in which.

DETAILED DESCRIPTION

Figure 1:
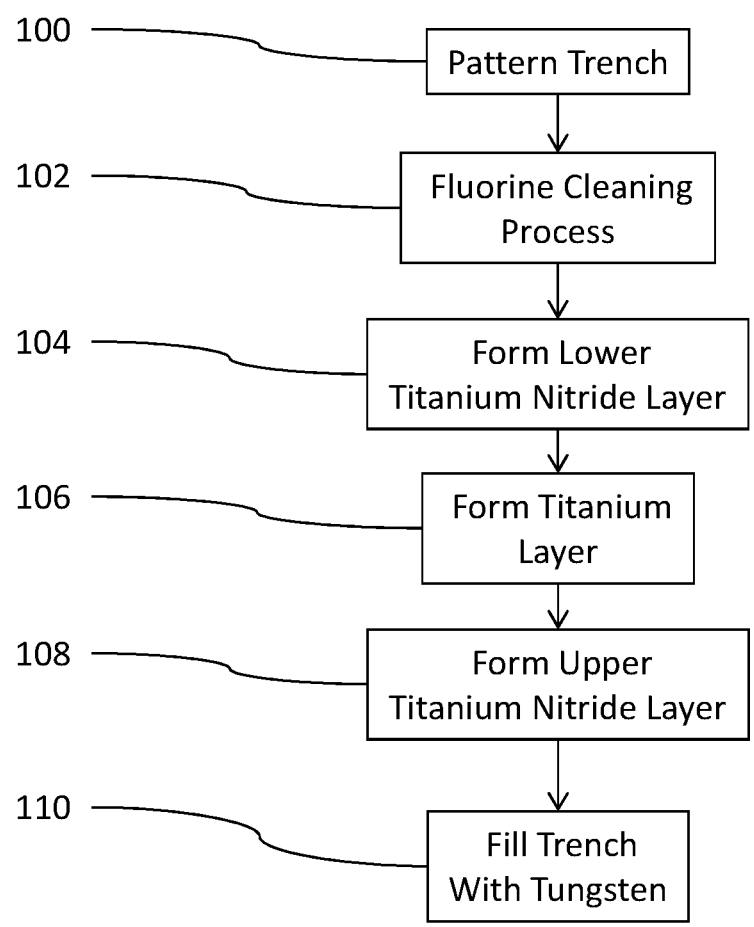
FIG. 1 is a flow diagram illustrating processing herein.

As mentioned above, during the formation of conductive contacts (CA) within integrated circuit devices, a cleaning process is performed before the openings are filled with the conductive material, and such cleaning processes sometime leave undesirable materials that can affect the operation of the contacts.

For example, fluorine sometimes remains after the cleaning processes. One exemplary process involves the simultaneous exposure of a substrate to $H_2$, $NF_3$ and $NH_3$ plasma by-products. Remote plasma excitation of the hydrogen and fluorine species allows plasma-damage-free substrate processing and such processing is largely conformal and selective towards silicon oxide layers, but does not readily etch silicon regardless of whether the silicon is amorphous, crystalline or polycrystalline. The selectivity provides advantages for applications such as shallow opening isolation (STI) and inter-layer dielectric (ILD) recess formation.

However, if fluorine particles remain after the cleaning process, the fluorine particles can undesirably distort the shape of subsequently formed layers, such as a titanium liner layer that lines the contact opening before the contact opening is filled with the conductor. For example, such particles can form TiF, which can undesirably increase the thickness of the middle liner layer. In view of this, the methods and the resulting devices herein utilize a multilayer (e.g., three-layer) liner that has a middle liner layer between two blocking layers. The lower blocking layer prevents the fluorine particles from affecting the other layers. For example, the blocking layers can be titanium composite materials (e.g., titanium nitride (TiN), titanium silicide (TiSi), titanium carbide (TiC), titanium alumide (TiAl), etc.), tungsten composite materials (e.g., fluorine-free tungsten (FFW), tungsten nitride (WN), tungsten carbide (WC), etc.), tantalum composite materials (e.g., tantalum nitride (TaN)), nickel composite materials (e.g., nickel silicide (NiSi)), etc. The middle liner layer can be made of titanium (Ti), tungsten (W), tantalum (Ta), nickel (Ni), titanium alumide (TiAl), titanium aluminum carbide (TiAlC), etc. Therefore, for example, the lower blocking layer and the upper blocking layer are formed of titanium composite materials, including titanium nitride (TiN), titanium silicide (TiSi), titanium carbide (TiC), and titanium alumide (TiAl) when the middle liner layer comprises titanium (Ti); the lower blocking layer and the upper blocking layer are formed of tungsten composite materials including fluorine-free tungsten (FFW), tungsten nitride (WN), and tungsten carbide (WC) when the middle liner layer comprises tungsten (W); the lower blocking layer and the upper blocking layer are formed of tantalum composite materials including tantalum nitride (TaN) when the middle liner layer comprises tantalum (Ta); the lower blocking layer and the upper blocking layer are formed of nickel composite materials including nickel silicide when the middle liner layer comprises nickel (Ni); etc.

The lower blocking layer within the multilayer liner blocks fluorine particles from reaching be middle liner layer, and thereby prevents the undesirable formation of defects, such as TiF. However, oxygen may pass through the blocking titanium nitride layer, allowing the middle liner layer to scavenge such oxygen to form, for example, $TiO_2$, which is favorable to the formation of TiF because $TiO_2$ has a much lower Gibbs energy than TiF.

FIG. 1 shows the processing performed by exemplary methods herein in flowchart form. In item 100, such methods pattern at least one opening within a substrate that is made from a silicon material. When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then, one portion of the resist can be rinsed off, leaving the other portion of the resist to protect the material to be patterned (which portion of the resist that is rinsed off depends upon whether the resist is a negative resist (illuminated portions remain) or positive resist (illuminated portions are rinsed off). A material removal process is then performed (e.g., plasma etching, etc.) to remove the unprotected portions of the material below the resist to be patterned. The resist is subsequently removed to leave the underlying material patterned according to the light exposure pattern (or a negative image thereof). Further, underlying patterned materials can be used as another mask layer to etch a subsequent layer.

A wet or dry cleaning process of the opening (item 102) is performed after the patterning process in item 100. The cleaning process can leave the walls and bottom of the opening contaminated with oxygen and fluorine particles. Any cleaning process, whether currently known or developed in the future can be used in item 102. Such cleaning processes often use various HCl, $NH_4$, and water rinse and drying stages to remove the debris left by the etching process in item 100.

In order to provide a barrier to such fluorine particles that may remain after the cleaning process in item 102, these methods form a three-layer barrier that is made of a lower blocking layer, a middle liner layer, and an upper blocking layer (sequentially formed (e.g., deposited) using physical vapor deposition, chemical vapor deposition, or any other technique known in the art). The lower blocking layer prevents the fluorine particles from affecting the other layers. More specifically, in item 104, the lower blocking layer is formed within the opening (the lower blocking layer directly contacts the surface of the opening). In item 106, the middle liner layer is formed within the opening (the middle liner layer directly contacts the lower blocking layer). In item 108, the upper blocking layer is formed within the opening (the upper blocking layer directly contacts the middle liner layer).

In such processing, the upper blocking layer is formed thicker (in the directions from the bottom and walls of the opening) than the lower blocking layer. For example, the upper blocking layer can be formed to be at least 3×, 5×, 10×, etc., thicker than the lower blocking layer.

After this, these methods fill the opening with a conductor layer (that directly contacts the upper blocking layer) in item 110. The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

Additionally, as the result of such processing, the middle liner layer can include an oxide (e.g., an oxide of titanium (Ti), tungsten (W), tantalum (Ta), nickel (Ni), titanium alumide (TiAl), titanium aluminum carbide (TiAlC), etc.). This oxide is formed from some of the oxygen scavenged from the bottom of the opening.

Figure 2:
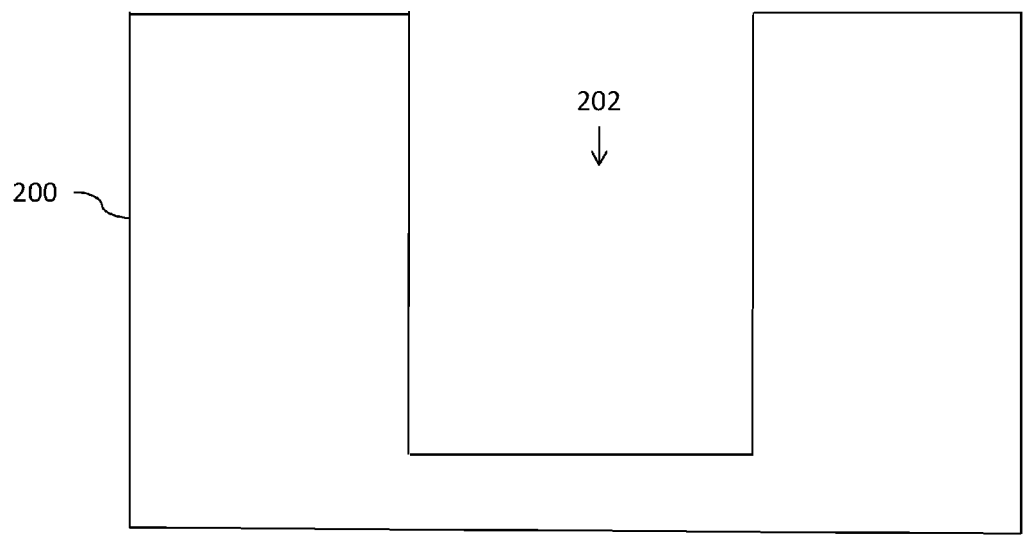
FIG. 2 is a cross-sectional schematic diagram illustrating structures and processing herein.
Figure 3:
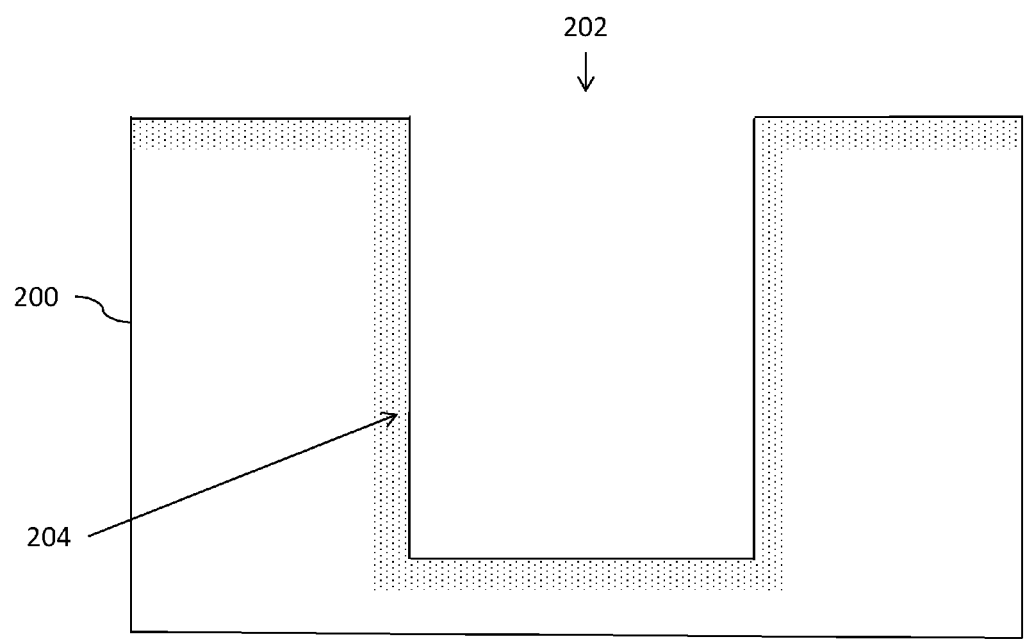
FIG. 3 is a cross-sectional schematic diagram illustrating structures and processing herein.

This processing is also shown through the schematic cross-sectional diagrams in FIGS. 2-9. More specifically, as shown in FIG. 2, such processing patterns at least one opening 202 within a substrate 200 of a multi-layer integrated circuit device (generally shown as item 220 in FIG. 8) that is made from silicon, and performs a cleaning process of the opening 202 after patterning. The cleaning process can leave the opening 202 contaminated with oxygen and fluorine particles 204, as shown in FIG. 3.

Figure 4:
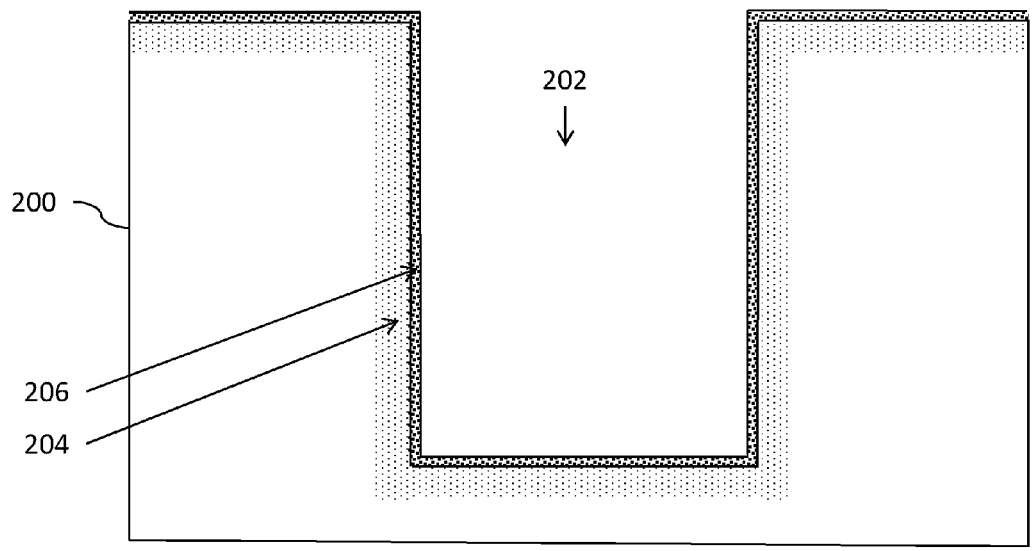
FIG. 4 is a cross-sectional schematic diagram illustrating structures and processing herein.
Figure 5:
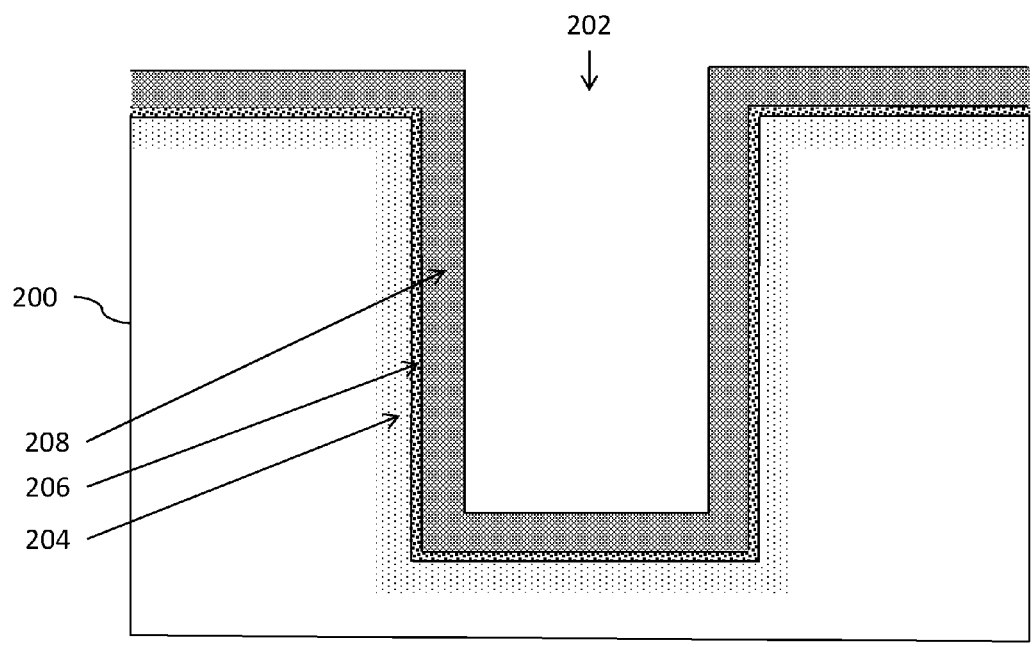
FIG. 5 is a cross-sectional schematic diagram illustrating structures and processing herein.
Figure 6:
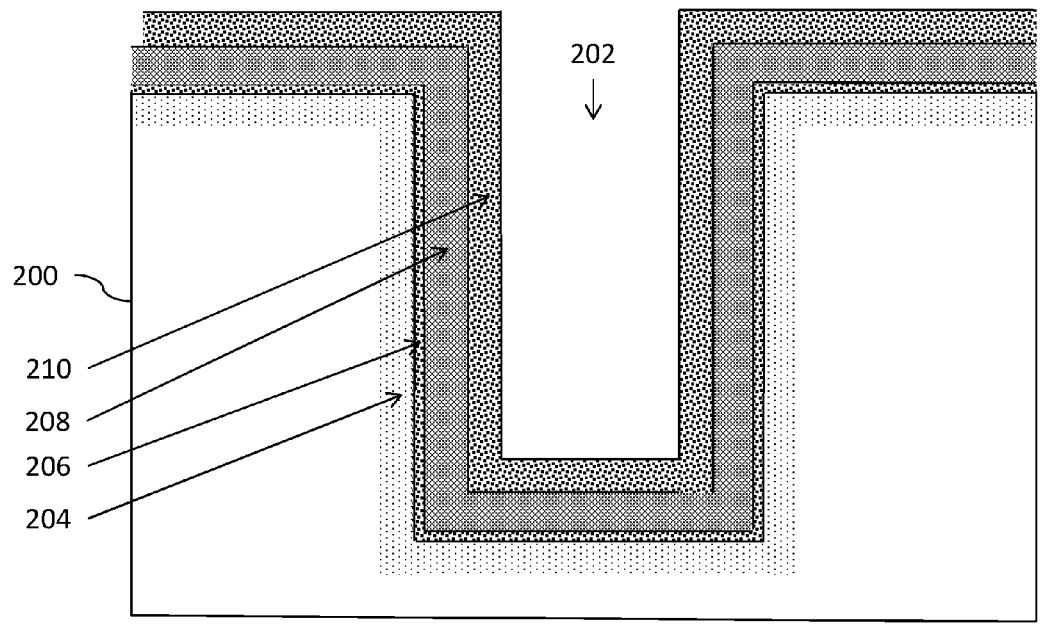
FIG. 6 is a cross-sectional schematic diagram illustrating structures and processing herein.
Figure 7:
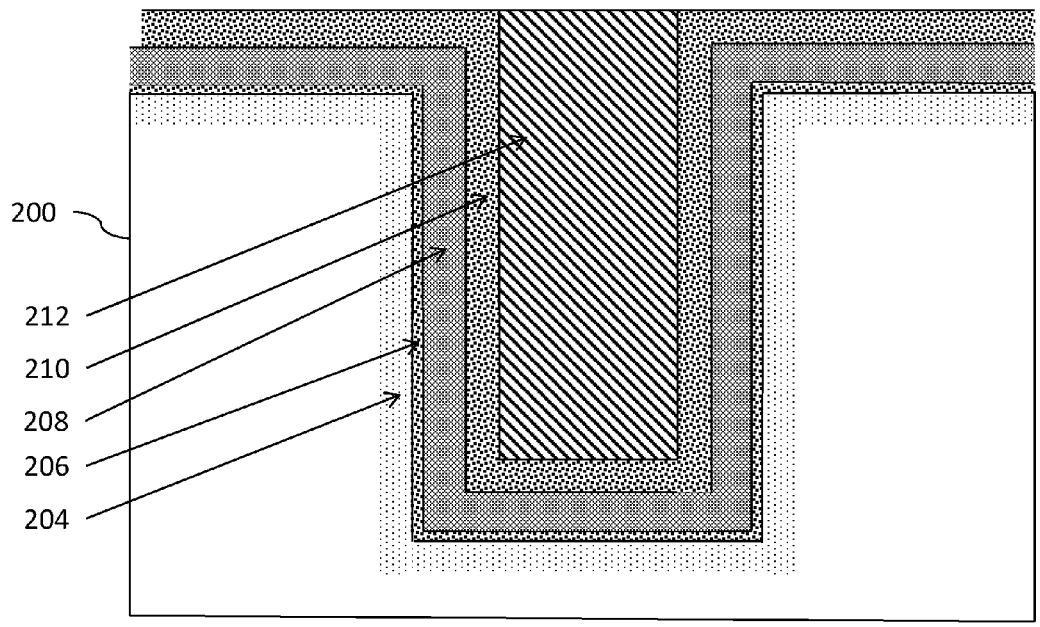
FIG. 7 is a cross-sectional schematic diagram illustrating structures and processing herein.

As shown in FIGS. 4-6, in order to provide a barrier to such fluorine particles 204, these methods form a three-layer barrier that is made of a lower blocking layer 206, a middle liner layer 208, and an upper blocking layer 210. The lower blocking layer 206 shown in FIG. 4 is formed within the opening 202 (the lower blocking layer 206 directly contacts the surface of the opening 202 and the oxygen and fluorine particles 204 are therefore within an area of the substrate 200 immediately adjacent (e.g., contacting) the lower blocking layer 206), the middle liner layer 208 as shown in FIG. 5 is formed within the opening 202 (the middle liner layer 208 directly contacts the lower blocking layer 206), and the upper blocking layer 210 as shown in FIG. 6 is formed within the opening 202 (the upper blocking layer 210 directly contacts the middle liner layer 208). After this, these methods fill the opening 202 with a conductor 212 layer (that directly contacts the upper blocking layer 210).

In such processing, the upper blocking layer 210 is formed thicker (in the directions from the bottom and walls of the opening 202) than the lower blocking layer 206. For example, the upper blocking layer 210 can be formed to be at least 3×, 5×, 10×, etc., thicker than the lower blocking layer 206. Additionally, the middle liner layer 208 can include an oxide, where the oxide is formed from some of the oxygen scavenged from the bottom of the opening 202.

Figure 8:
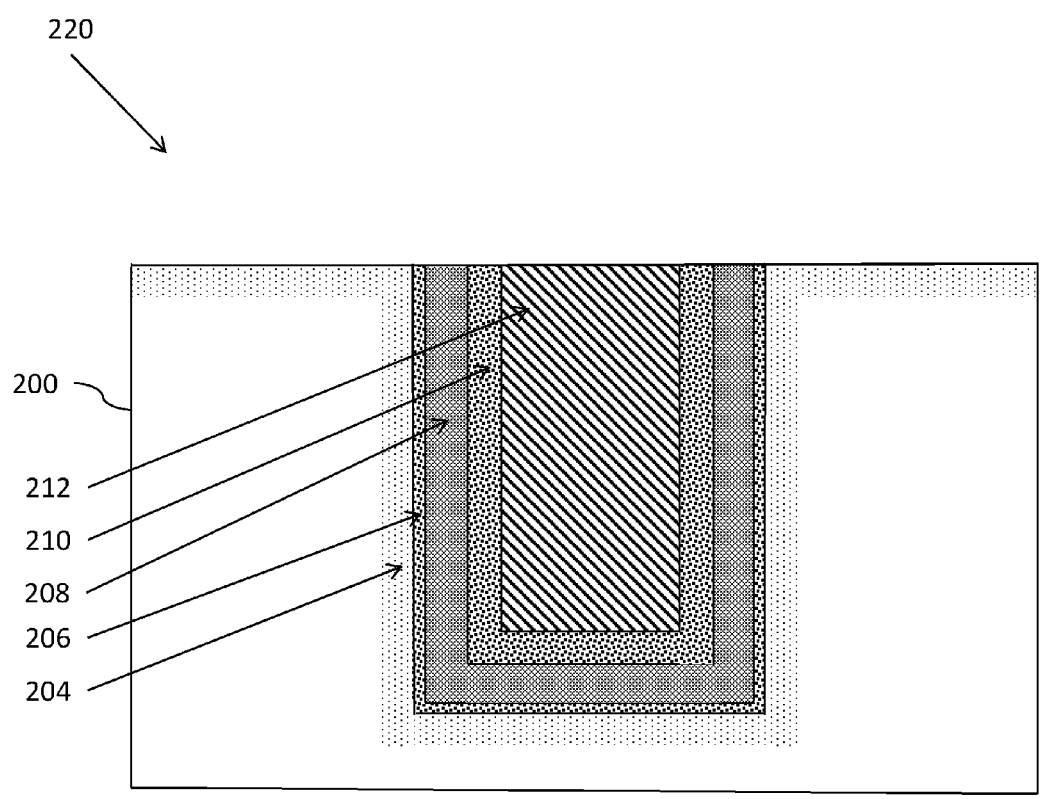
FIG. 8 is a cross-sectional schematic diagram illustrating structures and processing herein.

Planarization processing, such as polishing or chemical mechanical planarization (CMP) shown in FIG. 8, can remove material outside the opening 202. As shown in FIG. 8, such processing forms devices that include, among other structures, a substrate 200 made from a silicon material, and at least one opening 202 within the substrate 200. The opening 202 has opening walls that are approximately (approximately means, for example, a measure within 20% of an absolute measure) perpendicular to the surface of the substrate 200. The opening 202 has a bottom approximately parallel to the surface of the substrate 200, the bottom of the opening 202 is positioned distal to (meaning the portion of the structure that is furthest away from) the surface of the substrate 200, and the walls of the opening 202 are between the surface of the substrate 200 and the bottom of the opening 202.

The bottom of the opening 202 and the opening 202 walls are contaminated with oxygen and fluorine particles 204 post-etching (post-patterning) and post-cleaning. In order to provide a barrier to such fluorine particles 204, these structures include a three-layer barrier that is made of a lower blocking layer 206, a middle liner layer 208, and an upper blocking layer 210 (where the middle liner layer 208 is between the lower blocking layer 206 and the upper blocking layer 210). Thus, the lower blocking layer 206 is within the opening 202 (the lower blocking layer 206 contacts the bottom of the opening 202 and the opening 202 walls); the middle liner layer 208 is within the opening 202 (the middle liner layer 208 contacts the lower blocking layer 206); and the upper blocking layer 210 is within the opening 202 (the upper blocking layer 210 contacts the middle liner layer 208). Further, a conductor 212 fills the remainder of the opening 202, and the conductor 212 therefore directly contacts upper blocking layer 210 and forms a conductive contact within the multi-layer integrated circuit device.

Therefore, the oxygen and fluorine particles 204 remain after the cleaning process. In this structure, the upper blocking layer 210 is thicker (in the directions from the bottom and walls of the opening 202) than the lower blocking layer 206; and can be, for example, at least 3×, 5×, 10×, etc., thicker than the lower blocking layer 206. Additionally, the middle liner layer 208 can include an oxide. The oxide within the middle liner layer 208 includes the oxygen scavenged from the bottom of the opening 202.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to silicon nitride, silicon oxynitride, a gate dielectric stack of $SiO_2$ and $Si_3N_4$, and metal oxides like tantalum oxide. The thickness of dielectrics herein may vary contingent upon the required device performance.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements). The terminology used herein is for the purpose of describing particular embodiments only and is not intended to be limiting of this disclosure. As used herein, the singular forms "a", "an" and "the" are intended to include the plural forms as well, unless the context clearly indicates otherwise.

In the drawings herein, the same identification numeral identifies the same or similar item. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device comprising:
   a substrate of a multi-layer integrated circuit device, said substrate comprising silicon;
   an opening within the substrate, and a surface of the opening is contaminated with oxygen and fluorine particles;
   a lower blocking layer within the opening, and the lower blocking layer contacts the surface of the opening;
   a middle liner layer within the opening, and the middle liner layer contacts the lower blocking layer;
   an upper blocking layer within the opening, the upper blocking layer contacts the middle liner layer, and the middle liner layer is between the lower blocking layer and the upper blocking layer; and
   a conductor layer within the opening, and the conductor layer contacts the upper blocking layer and comprises a conductive contact within the multi-layer integrated circuit device.

2. The device according to claim 1, the oxygen and fluorine particles are within an area of the substrate adjacent the lower blocking layer.

3. The device according to claim 1, each of the lower blocking layer and the upper blocking layer comprise titanium composite materials selected from a group consisting of titanium nitride (TiN), titanium silicide (TiSi), titanium carbide (TiC), and titanium alumide (TiAl)) when the middle liner layer comprises titanium (Ti);
   each of the lower blocking layer and the upper blocking layer comprise tungsten composite materials selected from a group consisting of fluorine-free tungsten (FFW), tungsten nitride (WN), and tungsten carbide (WC) when the middle liner layer comprises tungsten (W);
   each of the lower blocking layer and the upper blocking layer comprise tantalum composite materials selected from a group consisting of tantalum nitride (TaN) when the middle liner layer comprises tantalum (Ta); and
   each of the lower blocking layer and the upper blocking layer comprise nickel composite materials selected from a group consisting of nickel silicide when the middle liner layer comprises nickel (Ni).

4. The device according to claim 1, the upper blocking layer is thicker than the lower blocking layer.

5. The device according to claim 1, the upper blocking layer is at least three times thicker than the lower blocking layer.

6. The device according to claim 1, the middle liner layer comprises an oxide.

7. The device according to claim 6, the oxide within the middle liner layer comprises the oxygen scavenged from the surface of the opening.

8. A device comprising:
   a substrate of a multi-layer integrated circuit device, said substrate comprising silicon, and the substrate has a surface;
   an opening within the substrate, the opening has opening walls perpendicular to the surface of the substrate, the opening has a bottom parallel to the surface of the substrate, the bottom of the opening is positioned distal to the surface of the substrate, and the bottom of the opening and the opening walls are contaminated with oxygen and fluorine particles;
   a lower blocking layer within the opening, and the lower blocking layer contacts the bottom of the opening and the opening walls;
   a middle liner layer within the opening, and the middle liner layer contacts the lower blocking layer;
   an upper blocking layer within the opening, the upper blocking layer contacts the middle liner layer, and the middle liner layer is between the lower blocking layer and the upper blocking layer; and
   a conductor layer within the opening, and the conductor layer contacts the upper blocking layer and comprises a conductive contact within the multi-layer integrated circuit device.

9. The device according to claim 8, the oxygen and fluorine particles are within an area of the substrate adjacent the lower blocking layer.

10. The device according to claim 8, each of the lower blocking layer and the upper blocking layer comprise titanium composite materials selected from a group consisting of titanium nitride (TiN), titanium silicide (TiSi), titanium carbide (TiC), and titanium alumide (TiAl)) when the middle liner layer comprises titanium (Ti);
    each of the lower blocking layer and the upper blocking layer comprise tungsten composite materials selected from a group consisting of fluorine-free tungsten (FFW), tungsten nitride (WN), and tungsten carbide (WC) when the middle liner layer comprises tungsten (W);
    each of the lower blocking layer and the upper blocking layer comprise tantalum composite materials selected from a group consisting of tantalum nitride (TaN) when the middle liner layer comprises tantalum (Ta); and
    each of the lower blocking layer and the upper blocking layer comprise nickel composite materials selected from a group consisting of nickel silicide when the middle liner layer comprises nickel (Ni).

11. The device according to claim 8, the upper blocking layer is thicker than the lower blocking layer.

12. The device according to claim 8, the upper blocking layer is at least three times thicker than the lower blocking layer.

13. The device according to claim 8, the middle liner layer comprises an oxide.

14. The device according to claim 13, the oxide within the middle liner layer comprises the oxygen scavenged from the bottom and the opening walls of the opening.

* * * * *